United States Patent [19]

Parker

[11] 4,006,414
[45] Feb. 1, 1977

[54] INDICATING DEVICE

[75] Inventor: Robert Parker, Danville, Calif.

[73] Assignee: The Regents of the University of California, Berkeley, Calif.

[22] Filed: Apr. 2, 1973

[21] Appl. No.: 346,877

Related U.S. Application Data

[63] Continuation-in-part of Ser. No. 69,399, Sept. 3, 1970, abandoned.

[52] U.S. Cl. .............................. 324/106; 73/356; 324/96; 350/160 LC
[51] Int. Cl. ......................................... G01r 31/00
[58] Field of Search .................. 324/96, 92, 106; 350/160 LC; 73/356

[56] References Cited

OTHER PUBLICATIONS

"Soild State RMS Recording Ammeter", by Robert Parker, Preprint UCRL - 73587, 12/16/71.

Primary Examiner—Donald O. Woodiel
Attorney, Agent, or Firm—Flehr, Hohbach, Test, Albritton & Herbert

[57] ABSTRACT

An indicating device in the form of a thin metallic foil such as manganin on which a temperature indicating material such as Tempilaq is sprayed the foil being tapered to provide a temperature gradient whereby the passage of current through the tapered wedge causes a melt line to occur indicating the amount of current flow.

7 Claims, 11 Drawing Figures

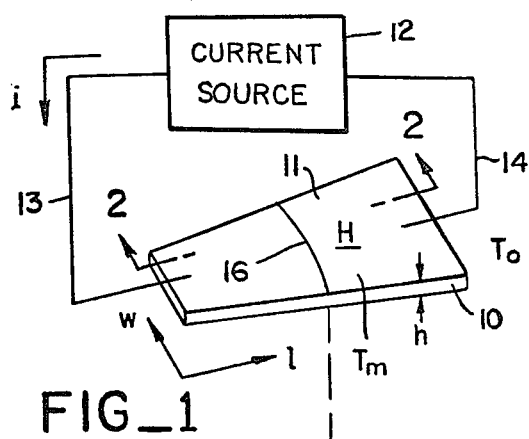
FIG_1
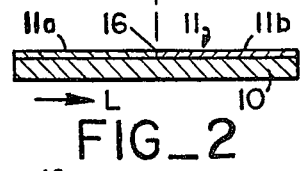
FIG_2
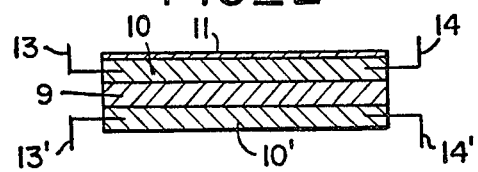
FIG_2A
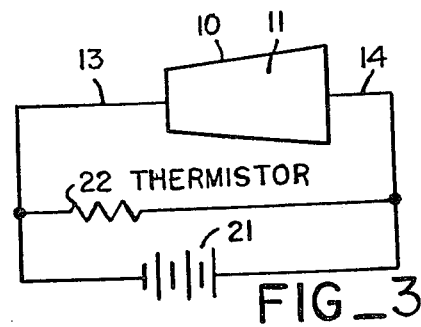
FIG_3
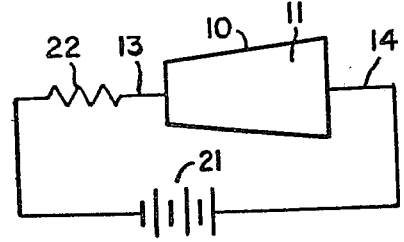
FIG_3A
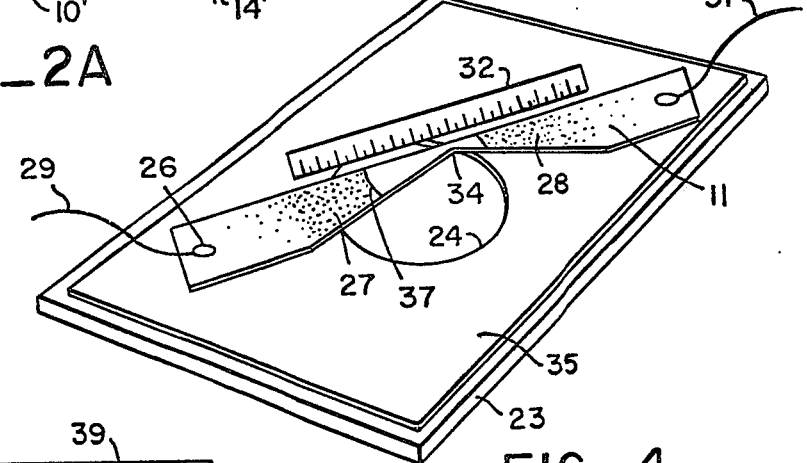
FIG_4
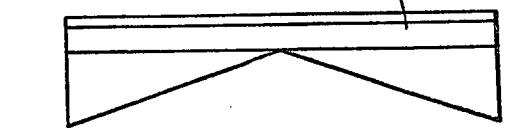
FIG_5
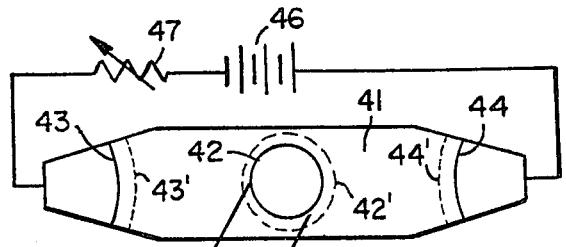
INCIDENT LASER BEAM
FIG_6
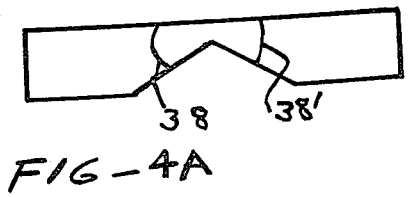
FIG_4A

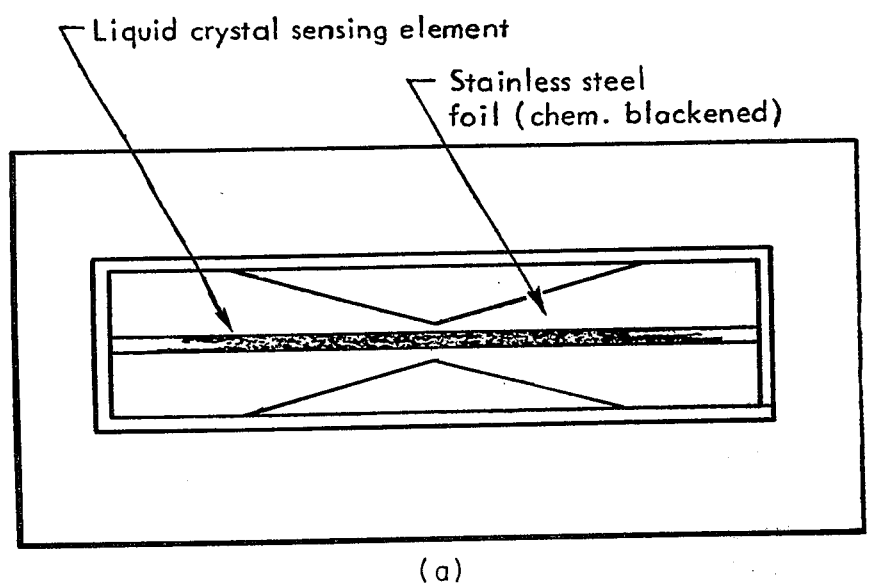
(a)
FIG._7
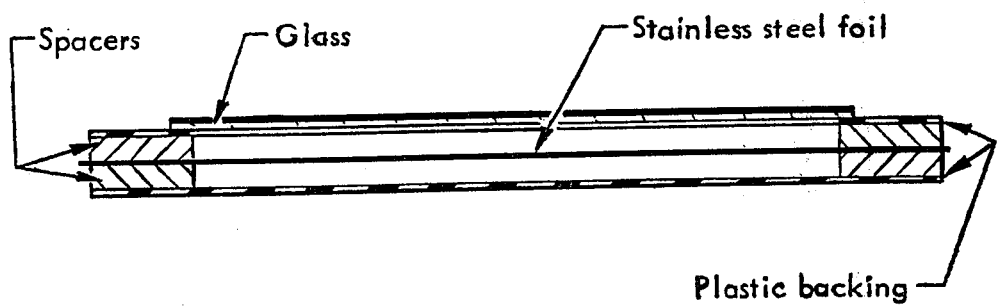
(b)
FIG._8

INDICATING DEVICE

CROSS-REFERENCE TO RELATED APPLICATION

This application is a continuation-in-part of copending application Ser. No. 69,399 filed Sept. 3, 1970 entitled "Indicating Device" in the name of Robert Parker, now abandoned.

BACKGROUND OF THE INVENTION

The present invention is directed to an indicating device and more specifically to a solid state type which has no moving parts.

Measurement of currents, both steady state and transient has heretofore been accomplished by expensive and mechanically complex indicating instruments. This has especially been true in the case of transient currents where the speed and amplitude of the transients are extreme. In addition, in the measurement of both transient and steady state currents, the measuring environment is awkwardly located, very small or constitutes a part of a rotating machine. It has been difficult to easily and adequately measure currents present.

The same is also true of temperature measuring devices which have been slow reacting and inaccurate.

Furthermore, both in the measurement of temperature and current, it is many times desirable to have a permanent record. In presently available devices, this requires additional recording equipment which is expensive, bulky and complex.

OBJECTS AND SUMMARY OF THE INVENTION

It is, therefore, a general object of the present invention to provide an improved indicating device. It is another object of the invention to provide an indicating device for steady state and transient currents. It is another object of the invention to provide an indicating device as the foregoing which is also capable of indicating temperature.

It is another object of the invention to provide an indicating device which is completely solid state and has no moving parts.

It is another object of the invention to provide an indicating device which provides a permanent record of its indication.

In accordance with the above objects, there is provided an indicating device comprising a thin tapered substrate comprising material of low thermal and electrical conductivity. A temperature indicating material is carried by said substrate much material changing from one physical state to another at a critical and predetermined temperature. The two ends of the tapered substrate are adapted for coupling to a current source. The tapered substrate has a temperature gradient along it wherein a sharp line of delineation appears on the indicating material between the material in its two states.

BRIEF DESCRIPTION OF THE DRAWINGS

FIG. 1 is a perspective view along with a circuit block diagram of apparatus embodying the present invention;

FIG. 2 is a cross-sectional view taken along the line 2—2 of FIG. 1;

FiG. 2A is a cross-sectional view showing another embodiment of the invention;

FIG. 3 is a circuit diagram showing an application of FIG. 1;

FIG. 3A is a circuit diagram showing a modification of FIG. 3;

FIG. 4 is a perspective drawing showing another embodiment of the invention;

FIG. 4A is a plan view of a portion of FIG. 4 under transient conditions;

FIG. 5 is an elevation view showing yet another embodiment of the invention;

FIG. 6 is a plan view along with associated circuitry showing yet another embodiment of the invention;

FIG. 7 is a top view of an ammeter embodying the present invention; and

FIG. 8 is a cross section view taken along line 8—8 of FIG. 7.

DETAILED DESCRIPTION OF THE PREFERRED EMBODIMENT

Referring now to FIGS. 1 and 2, the principle of operation of the invention is illustrated. The device includes a thin tapered substrate 10 comprising material of relatively low thermal and electrical conductivity. A typical material would be manganin which is a type of nickel-iron alloy which has a constant resistivity even with temperature changes. Deposited on at least one surface of the tapered substrate 10 is a material 11 which in response to critical temperature changes from one physical state to another. Temperature indicating material 11 is an insulator. Normally the entire surface of the substrate would be coated or in some embodiments both its top and bottom surfaces. A current source 12 is coupled by means of leads 13 and 14, as illustrated, to the substrate 10.

The tapered substrate 10 produces a temperature gradient along it whereby when a current I from current source 12 is imposed on the substrate, a sharp line 16 of delineation appears on the indicating material 11 between the material in its two states. Such material may, for example, be a material known by the trademark Tempilaq which is a trademark of the Tempil Division of Big Three Industrial Gas and Equipment Company for its temperature indicating material.

In general, when current flows through the substrate material (and substantial current will flow through this material because of the insulating characteristic of the indicating material 11) melt line 16 appears. The coating on the portion 11a melts in the case of Tempilaq and becomes a liquid and becomes more translucent as opposed to the portion 11b which, since it has been sprayed on, is somewhat opaque and granular in appearance. This material or any temperature indicating material used should have a relatively critical change of state temperature, e.g. $T \pm .2°$ C, in order to provide a sharp line of delineation.

One characteristic of the Tempilaq paint is that it is irreversible; in other words, once the melt line appears and moves upon along the distance L of the substrate 10 it cannot be reversed. A material which is reversible and can also be used for the surface coating 11 is known as a liquid crystal material which is of the cholesteric mesophase type. These are reversible indicators which change color within a narrow temperature range, for example, at 50° centigrade from 0.2° centigrade to 0.5° centigrade. It has been assumed that this change in color can be considered a change of state as defined in the present invention. Such liquid crystals are available under that generic name from the Roche Chemical Division of Hoffmann-LaRoche, Inc., of Nutley, New Jersey.

It is important that the substrate 10 be of relatively poor electrical and thermal conductivity since a good conductor both from a thermal and electrical standpoint would diffuse the melt line 16 thus causing a poor or non-existent indication.

That the device of the present invention as thus illustrated in FIGS. 1 and 2 is usable as an ammeter and thermometer can be shown by the mathematical proof below. The problem can be approached by balancing the heat in and the heat out of the device; such heat can be supplied by either or both the current source and the ambient temperature surrounding the device. The heat in is $$i^2 R = i^2 \rho \frac{L}{A} = \frac{i^2 \rho}{Wh} \text{ per unit length} \quad (1)$$

and heat out is $$(T_m - T_o) HA \quad (2)$$

where $T_m$ is the melting temperature of the temperature indicating material, $T_o$ is the ambient temperature, $\rho$ is the resistivity of the substrate material and H is the film coefficient of the temperature indicating material. Setting equation (1) equal to equation (2) yields $$A (T_m - T_o) H = \frac{i^2 \rho}{Wh} (0.239) \quad (3)$$

The factor 0.239 converts joules to calories. A is a per unit length measurement but twice the quantity W plus h where both surfaces of the substrate are exposed to air. Solving for $i^2$ yields $$i^2 = \frac{[(T_m - T_o) HWh (0.239)] 2(W + h)}{\rho} \quad (4)$$

If W is much greater than h then $$i^2 = \frac{(T_m - T_o) Hh (0.239) W^2}{\rho} \quad (5)$$

providing for the ratio $i^2/W^2$ gives $$\frac{i^2}{W^2} = K_o = \frac{(T_m - T_o) Hh (0.239)}{\rho} \quad (6)$$

If W is related to L as a linear function as $$w = K(L) \quad (7)$$

then $$i = K_1 L \quad (8)$$

This means that if a substrate having the shape substantially shown in FIG. 1 is used where W varied in direct proportion to L then the distance L from the origin to the melt line 16 provides a direct linear indication of current. Therefore, a linear ammeter is provided. A measurement of the melt distance L may directly calibrated in current. Equation (8) assumes the ambient temperature is maintained constant. Moreover the current measured here is true peak RMS current. In essence the device integrates the square of the current passing through it.

The device of the present invention can also be used to provide a linear measurement of temperature. For example, if we let $$w = \frac{K}{\sqrt{L}} \quad (9)$$

then $$L = K_2(T_m - T_o) \quad (10)$$

Here it is assumed that the current is constant and normally below the threshold or the point at which the temperature indicating material begins to melt. As the temperature rises this causes the material to melt because of the foregoing heat balance equation and a linear change in temperature is thereby indicated. In view of equation (9) the taper of the substrate 10 would have curved sides to conform with equation (9).

FIG. 2A illustrates a modification useful as an operational device. An additional substrate 10' is juxtaposed with original substrate 10 with an intermediate insulating layer 9 sandwiched between them. Heat in substrate 10' produced by current through leads 13', 14' is transferred through layer 9 to substrate 10. The delineation line on material 11 therefore is an indication of the sum of currents through substrates 10 and 10'.

Direct temperature measurement such as discussed above may also be accomplished in the manner as shown in FIG. 3 where a current source is provided in parallel with a thermistor 22 both coupled to lines 13 and 14 of device 10, 11. The thermistor would be in the temperature critical location and vary the current through the substrate 10 and coating 11 in accordance with changes in temperature.

Alternatively thermistor 22 can be used in current measurements for compensating for ambient temperature, $T_o$, changes (see equation 10). Specifically, is illustrated in FIG. 3A, thermistor 22 is placed in series with and in close proximity to substrate 10.

FIG. 4 illustrates a device useful for measuring both steady state and transient currents and includes an insulating base 23 having a central aperture 24 on which is mounted a thin metallic foil 26, a first wedge portion 27, and a second wedge portion 28. On foil 26 is an indicating material 11. Foil 26 also has electrical contacts 29 and 31.

Wedge portion 27 has no backing since it bridges over aperture 24; wedge portion 28 is backed by the insulating material 23 which may be composed, for example, of fiber filled epoxy material. A scale 32 is laid along the straight edge of the metal foil 26 the scale 0 centered at the apex 33 which lies substantially over the edge of aperture 24. The entire assembly may be encapsulated in protective plastic 35 if desired.

In operation as electrical current passes through the taper the narrowest end part becomes warm. At some critical current level depending upon geometry of the taper the temperature indicating material 11 on the taper transforms or changes state. As the current increases a sharp melt line or temperature indication moves up the unbacked wedge portion 27 in a linear fashion with increasing current. This melt line is shown at 37. Wedge portion 28 which is backed by insulating substrate 23 shows little or no change because the large area backing acts as a heat sink and absorbs the heat generated by this side of the metal foil.

However, when a transient is impressed on this device a melt line forms on both of the wedges 27 and 28. This is because there is insufficient time for the heat in the backed wedge portion 28 to be transferred to the substrate 23 before effecting and permanently changing the temperature indicating material. Thus, as illustrated in FIG. 4A the symmetrical melt line 38, 30' would appear giving a permanent indication of the transient current which passes through the device.

For a linear indication of transient current, or $\int i^2 dt$, the taper must be adjusted as $$w = K \sqrt{L} \qquad (11)$$

The foregoing can be derived from $$\Delta T = \frac{0.239 \, \rho}{d C_\nu W^2 h^2} \int i^2 dt \qquad (12)$$

where d is the density of substrate material 10, $C_p$ is its specific heat and $\Delta T$ is the state change temperature with reference to ambient temperature. Equation 11 differs from equation 3 in that there is insufficient time for a heat loss to occur and energy is stored internally in the substrate. For a more complete derivation see UCRL-71968 Rev. 1 entitled "A Passive Technique for Measuring High Transient Currents" dated Feb. 10, 1970, by Robert Parker.

FIG. 5 shows an alternative geometry of the coating which may be placed in a narrow band 39 to eliminate or avoid edge effects. This will perform in the same manner as previously discussed temperature coating configurations; coating 39, of course, may be either irreversible material such as Tempilaq or such material as liquid crystal which is reversible.

The embodiment of FIG. 6 provides a method of measuring the distribution of energy in a laser beam or other similar beam. Initially, the laser beam would be directed upon the surface 41 and would produce a melt zone indicated at 42 with accompanying melt lines 43 and 44. The entire structure would, of course, consist of the substrate with either the reversible or irreversible temperature indicating material coated thereon. A current source 46 along with a variable resistor 47 provides the necessary critical current to change the state of the temperature indicating material.

With the incident laser beams still on surface 41 resistance 47 is reduced causing an increase in temperature of the assembly. This would increase the size of zone 42 because of the increased temperature caused by the current, to the dashed area 42'. This change of area is related to the energy distribution of the laser beam and can be correlated with the increase of the melt lines 43' and 44'.

It is felt that the temperature indicating material with its very precise melt line also has the advantage of being available for "calibration", that is, a specific calibrating current after a measurement is taken can be incremented through the device and then it can be recalibrated. The fact that the device of the present invention is relatively small, has no moving parts and is mechanically durable lends itself to many commercial applications. Some of these uses may include permanent installation on motors of all types for diagnostic purposes where undesirable transient currents could be recorded showing how servere the transient was. This would then indicate whether or not it would be worthwhile to overhaul the motor. The same is true of electric components. The invention could also be used in a transformer to measure lightning strikes in determining whether or not the dielectric was permanently damaged in the transformer. Another use is as a fault finder in transmission lines to indicate the magnitude of the fault current.

All of the foregoing uses would most suitably use an irreversible or Tempilaq type of temperature indicator. An ammeter, of course, would preferably use a liquid crystal or reversible temperature indicating material. As discussed above the shape of the device can be modified to indicate either current or temperature.

The dual taper which is used in the present invention avoids end effects. However, a taper only on one side is, of course, still suitable since it provides the necessary temperature gradient. In addition, a temperature indicating coating could be used on both sides of the substrate for greater sensitivity. Another modification may be a combination of reversible and irreversible temperature indicating materials which may be combined for measurement of both steady state and transient currents.

It is also apparent that the present invention may find many uses in control loop situations for either a change in the thermal or electrical property of an ambient situation being measured. Feedback would be provided by an optical device to sense where the melt line was occuring.

FIGS. 7 and 8 show a commercial ammeter which has already been implicitly described above. As discussed previously, to eliminate end effects the ammeter includes a first tapered section 51 and a second tapered section 52. They are both connected together at narrow ends 53 the entire substrate 54 being suspended in the ambient air or gas by the spacers 56 and 57 as illustrated in FIG. 8. Substrate 54 itself is composed of either steel material or manganin. The foil-like material is preferrably ½ mil thick with a resistivity of 75 to 100 micro ohms per centimeter. Referring specifically to FIG. 8, glass window 58 is provided for viewing the melt lines of the narrow strip of liquid crystal material 59 which would, of course, occur in a symmetrical manner similar to that of FIG. 4A. A suitable scale 61 is provided as in FIG. 4. Thus, the device of FIGS. 7 and 8 is for measurement of steady state currents and not transient current as is true of the embodiments of FIGS. 4 and 4A.

The use of the narrow strip of liquid crystal indicating material 59 is for the same purposes as illustrated in FIG. 5; that is, of eliminating edge effects. In addition the double taper eliminates end effects because of the symmetrical arrangement and the fact that there is no relatively cold large mass at the origin which in this case would be 53. Thus, in accordance with the above mathematical discussion the current is a linear function and is related to a constant and merely the distance, L, of the melt line from the origin 53.

The foregoing embodiment of FIGS. 7 and 8 is disclosed in a paper which was prepared for submittal to the IEEE Power Engineering Society December meeting in San Francisco, California, July 9–14, 1972. It is entitled "Solid State RMS Recording Ammeter" by Robert Parker. The preprint of the paper dated Dec. 16, 1971 was distributed some time earlier to a selected list of people as set out in the paper and is listed as Lawrence Livermore Laboratory Preprint UCRL-73587.

Thus, the present invention provides an improved indicating device which has no moving parts, is rugged, provides permanent indications of changes in current or temperature along with transients for both steady state and transient current conditions. In addition, measurement of temperature is provided.

I claim:

1. An indicating device comprising: a first thin foil-like substrate comprising: material of low thermal and electrical conductivity having at least one tapered section; means for suspending at least a portion of said substrate in ambient gas at two ends; temperature indicating material carried by said substrate such material changing from one physical state to another at a critical and predetermined temperature; means for coupling said substrate to a current source, said substrate having at least one temperature gradient along it wherein a sharp line of delineating appears on said indicating material between such material in its two states.

2. A device as in claim 1 where said substrate includes another tapered section series connected at its narrow end to said one tapered section and comprised of said same material and having said indicating material thereon said current source being coupled across said series connected substrate sections whereby said dual tapered substrate avoids end effects.

3. A device as in claim 2 where said other tapered section is backed by an insulating substrate which acts as a heat sink, said one tapered section still being exposed to said ambient gas whereby with said current source producing a steady state current only said indicating material on said one tapered section has a line of delineation but with a transient current lines forms on both of said sections.

4. An indicating device as in claim 1 in which said temperature indicating material is of a liquid crystal type which changes color at a critical temperature which color change is reversible back to its original condition when the temperature is reduced below said critical temperature.

5. A device as in claim 1 where said device includes protective encapsulation means whereby said substrate is protected from convective winds.

6. A device as in claim 1 where said temperature indicating material is in the form of a narrow band on said substrate to avoid edge effects.

7. A device as in claim 1 where said tapered section provides a direct linear indication of current, i, in accordance with $i = K_1 L$ where $K_1$ is a constant and $L$ is the distance from the origin to a line marking said change of physical state.

* * * * *